United States Patent [19]

Bauer

[11] 4,022,990

[45] May 10, 1977

[54] TECHNIQUE AND APPARATUS FOR MEASURING THE VALUE OF A CAPACITANCE IN AN ELECTRICAL CIRCUIT SUCH AS A TELEPHONE COMMUNICATION LINE

[75] Inventor: Paul R. Bauer, Palo Alto, Calif.
[73] Assignee: Wiltron Company, Palo Alto, Calif.
[22] Filed: Oct. 28, 1975
[21] Appl. No.: 626,315
[52] U.S. Cl. .................. 179/175.3 F; 324/60 CD
[51] Int. Cl.² ................................... H04B 3/46
[58] Field of Search ............ 179/175.3 R, 175.3 F; 324/60 C, 60 CD

[56] References Cited
UNITED STATES PATENTS

| | | | |
|---|---|---|---|
| 2,607,528 | 8/1952 | McWhirter et al. | 324/60 CD |
| 3,193,803 | 7/1965 | Hoffman | 324/60 CD |
| 3,370,229 | 2/1968 | Hamburger et al. | 324/60 CD |
| 3,453,535 | 7/1969 | Anglin | 324/60 CD |
| 3,886,447 | 5/1975 | Tanaka | 324/60 CD |

Primary Examiner—Douglas W. Olms
Attorney, Agent, or Firm—Limbach, Limbach & Sutton

[57] ABSTRACT

A technique for measuring the value of a capacitance that is inseparatably connected with other circuit elements as part of a composite electrical circuit. The measurement is insensitive to such other elements that include resistances, inductances and active voltage sources. The technique involves the charging of the unknown capacitance followed by an immediate transfer of that charge to an external known capacitance that is part of an integrating circuit. The voltage stored by the known capacitance is unaffected by series resistances and is proportional to the desired electrical circuit capacitance being measured. The effect of induced or generated interfering signals in the circuit are cancelled by transferring the charge to the known capacitor for a period equal to an integral multiple of periods of the interfering signal. Furthermore, the charging voltage is adapted to the particular circuit in order to compensate for any resistance shunting the capacitance being measured. These techniques have a particular application to capacitive measurements of telephone communication lines.

29 Claims, 5 Drawing Figures

TECHNIQUE AND APPARATUS FOR MEASURING THE VALUE OF A CAPACITANCE IN AN ELECTRICAL CIRCUIT SUCH AS A TELEPHONE COMMUNICATION LINE

BACKGROUND OF THE INVENTION

This invention relates generally to a technique and apparatus for measuring capacitance that is connected as part of a circuit of other passive elements and which is subject to having an interfering signal induced or generated therein. Although not so limited, the techniques of the present invention are particularly useful for measuring capacitance along a telephone communication line.

There are many occasions wherein the capacitance of a telephone line is desirable information. Such capacitance measurements are made regularly by telephone companies. One application is for determining the location along a lengthy telephone cable of an "open" or break in a wire of the cable. The normal capacitance value per unit length is known for telephone cables. The measurement of the capacitance serves to provide information as to the distance down the cable from the point where the measurement is being taken to where the open condition exists. Repair persons can then be sent to the proper location along the cable to effect the repair.

Another telephone application of capacitive measurement is for determination of the number of telephone sets that are connected to a telephone line. Each telephone set contains a capacitor as part of its ringing device.

Another application of measuring the capacitance of a telephone line is to determine whether an undesired branching line (commonly called a bridge tap) exists somewhere on the line. Yet another telephone application is to determine the capacitance associated with an impedance matching circuits to see if the capacitance value is correct or not.

In all of these telephone line capacitance measurement applications, the value of the capacitance to be measured is intermingled with resistances and inductances as part of the line itself or as part of devices attached to the line. In some cases of faulty lines being tested, there is additionally a finite shunt conductance across the telephone line. These conditions make it impossible to separate out the capacitive element in the telephone line by itself for easy measurement. Thus, the problem exists for measuring that capacitance accurately without the other resistive and inductive elements adversely affecting the results.

Furthermore, since telephone lines are often placed in close proximity to power lines, there may be a voltage induced therein having a frequency of that of the power line or some harmonic thereof. An accurate capacitance measurement technique must be able to operate without its results being affected by such induced voltage. These voltages are especially high when a capacitive measurement is made between one conductor of a telephone line and ground potential, a measurement often made in determining the location of a break of one conductor of a telephone line pair.

Common alternating current methods of measuring capacitance cannot be used in such an environment because the capacitance cannot be separated from resistances and inductances that are present. A telephone line is a selective network for alternating current signals with some frequencies being rejected and others accepted. Therefore, alternating current measurements of telephone lines give results that depend upon the parameters of the transmission media between the measuring point and the capacitance to be measured. The capacitance itself is not accurately measured.

It is thus necessary to use low frequency techniques that respond to a charge that the unknown capacitance can absorb. Most telephone central offices today use a crude technique wherein a large direct current voltage is applied to the telephone line through a current activated meter by the closing of a switch. The amount of "kick" of the pointer of the meter during charging gives the operator an indication of the amount of charge that has passed from the voltage source to the capacitance of the telephone line. This method is extremely inaccurate but it does overcome the problem of series inductance in the circuit along with the capacitance being measured.

An alternate technique is to charge the capacitance of a telephone line from the testing point by application of a direct current voltage thereto and then use precision measurement circuits to measure the stored charge within the unknown capacitance of the telephone line, from which that capacitance value can be calculated. There are many problems in adapting such a general technique to telephone line capacitance measurements, however, because of extraneous circuit elements and induced voltages. The undesirable effects of shunt and series resistances that exist as permanent attachments to the capacitance to be measured can be eliminated if the measuring device has a zero input impedance at low frequencies. But use of a zero input impedance approach is undesirable for another reason: input circuit protection of the measuring device must be provided. Since telephone cables typically extend into an electrical environment that is not well controlled, the possibility of sudden large voltages appearing on the telephone cable at some instance of time is very likely. It is possible to seriously damage a measuring instrument that does not have some current limiting element, such as a series resistance, at its input.

Therefore, it is desirable to have a capacitance measuring device that is not affected by the existance of series and shunt resistances but which can still employ a series impedance in the input of the device as current limiting protection against voltage surges. It is an object of this invention to provide such a technique and apparatus.

It is a further object of this invention to provide a technique and apparatus for measuring remote capacitance values that are insensitive to induced or generated interference alternating current signals.

It is another object of this invention to provide a technique and apparatus for measuring capacitance in a circuit that may have a steady state direct current voltage applied thereto.

It is yet another object of this invention to provide a technique and apparatus for measuring capacitance that is insensitive to induced random noise.

SUMMARY OF THE INVENTION

These and additional objects are accomplished by the techniques of the present invention wherein a telephone line or other composite electrical circuit whose capacitance is to be measured is first subjected to a direct current voltage to charge that capacitance and the charge is then transferred from the circuit under test to a known capacitor in the instrument which may be part of an integrating circuit. A series input impedance may be provided for instrument protection. The voltage across the known capacitance after charge transfer is directly proportional to the value of the unknown circuit capacitance. The accuracy of the unknown capacitance measurement is unaffected by the existance of any protective instrument input impedance or series impedance in the circuit under test.

In order to make a capacitive measurement that is unaffected by a finite resistance shunting the capacitor, the charging is accomplished by an adaptive circuit that increases the voltage applied to the circuit an amount which compensates for the effect of a shunt conductance path draining off charge from the unknown capacitance before it can be transferred into the known capacitor of the instrument. The adaptive charging circuit is responsive to current flow into the circuit under test and operates upon the realization that the current into the circuit after the capacitor has been fully charged is an indication of the shunt resistance operating across that capacitance. The effect of the shunt conductance path is compensated for by increasing the charging voltage without necessity of determining what that shunt resistance is.

The effect of an interfering alternating current signal that may be induced in the circuit under test from a power line or other source is eliminated if the time chosen for transfer of the charge from the circuit capacitance under test to the known capacitance of the instrument is carefully controlled to be an integral number of periods of the fundamental frequency of that interfering signal. When this requirement is met, the positive induced voltage is exactly equal to the negative induced voltage and thus its effect on the capacitance measurement is eliminated. Such synchronism may be obtained by use of an oscillator, such as a precision crystal control oscillator, to give a reference signal having the same period as the interfering signal. Since the interfering signal may not always be exactly the same frequency, however, it is preferable to control the charged transfer time from the interfering signal itself. This may be done by sensing the interfering signal in the circuit being investigated and locking the charge transfer time to that signal, or by connection directly to the power line or other interfering signal source if it is convenient. The two techniques may be utilized in cooperation by having a crystal controlled oscillator that becomes locked to the interfering signal for sufficient interfering levels to activate the locking circuit.

Additional objects, advantages and features of the various techniques of the present invention will become apparent from the following description of its preferred embodiment which should be taken in conjunction with the accompanying drawings.

DESCRIPTION OF THE PREFERRED EMBODIMENTS

Figure 1:
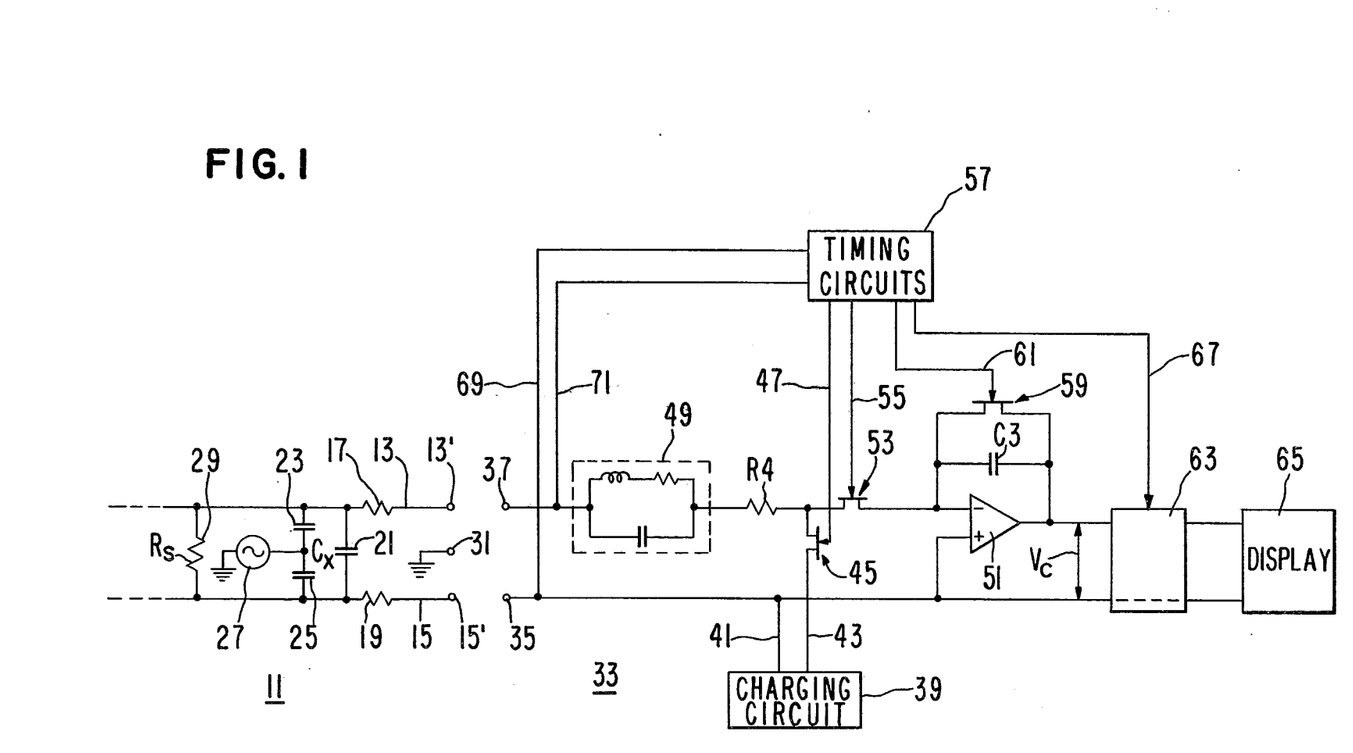
FIG. 1 is a general block and schematic diagram of an instrument embodying the techniques of the present invention.

Referring to FIG. 1, a telephone communication line of the usual type is illustrated as an equivalent circuit 11. The particular equivalent circuit shown is convenient for explaining the operation of the various aspects of the present invention. Two telephone lines 13 and 15 each have some series resistance 17 and 19, respectively, as an inherent and inseparable of a telephone line. A capacitor 21 represents a portion of the capacitance along the telephone line between the two wires 13 and 15. Additional capacitors 23 and 25 are also shown in series between the two conductors 13 and 15 of the telephone line with a source 27 connected between the junction of the two capacitors and ground potential. The source 27 represents an A.C. voltage induced in the telephone line by magnetic and electrostatic fields through which the line passes. The fields of concern are most commonly generated by adjacent power lines. The induced voltage 27 which is most often present is thus a periodic waveform with a fundamental frequency of 60 Hertz as well as possibly harmonics thereof (50 Hertz and harmonics in power systems of some foreign countries).

This capacitance between the conductors 13 and 15 is lumped together for the purposes of discussion and denoted as $C_x$. In a faulty telephone line, there will be some current leakage between the conductors and this current path as illustrated in FIG. 1 by a resistance 29 that is denoted as $R_s$. It is the existance of the series resistances 17 and 19 of the telephone line conductors and the shunt resistances 29 that makes it difficult to measure the value of $C_x$ from some point in the telephone line, such as the terminals 13' and 15' of FIG. 1. Additionally, there is some inductance along the length of the telephone line and connecting circuits. Further, equipment of various types connected to the telephone line also adds other passive and active parameters which affect what is being measured at the terminals 13' and 15'. The measurement of the capacitance value $C_x$ is further complicated by the fact that it and the resistive and inductive parameters are mixed together and distributed along a long line of the telephone line. As explained earlier, a primary application of measuring the capacitance $C_x$ either between the two terminals 13' and 15', or between one of them and a ground potential terminal 31, is to determine the distance from the terminals 13' and 15' along the telephone line where a break in one or both of the conductors exists. The techniques of the present invention also have application in measuring capacitance values of instruments or other circuits connected to the telephone conductors 13 and 15, a measurement which is also complicated by the series and shunt resistances and series inductances.

A test instrument 33 for accurately measuring the value of $C_x$ is generally illustrated in FIG. 1. The instrument 33 has a common input terminal 35 and a second input terminal 37. A circuit 39 generates a direct current voltage between lines 41, connected to the common terminal 35, and a line 43. A semiconductor switch 45, preferably in the form of a FET, is connected in series with the charging circuit output line 43.

The semiconductor switch 45 is turned on or off according to a signal in a line 47 applied to its gate. The charging voltage from the circuit 39 is applied to the instrument terminals 35 and 37, through a current limiting resistance R4 and an optional resonant filter 49, when the semiconductor switch 45 is in a conductive state.

An integrating circuit formed of an operational amplifier 51 and a feedback integrating capacitor C3 also has its input connected through the resistance R4 and optional filter 49 to the instrument terminals 35 and 37 when a second semiconductor switch 53 is in a conductive state. The switch 53 is controlled by a proper voltage applied to its gate lead 55. This integrating circuit, when so connected, transfers the charge from the line capacitance $C_x$ to the integrating capacitor C3. The semiconductor switches 45 and 53 are operated to alternately charge the capacitance $C_x$ from the circuit 39 and then discharge it into the capacitor C3. The semiconductor switches 45 and 53 thus operate as a single pole, double throw switch, connecting only one of the integrating amplifier 51 and charging circuit 39 to the terminals 35 and 37 at any one instant. This sequence is controlled by appropriate timing circuits 57.

The integrating operational amplifier 51 has its non-inverting input connected directly to the common instrument terminal 35 and its inverting input connected to the semiconductor switch 53. The integrating capacitor C3 is connected from an output of the operational amplifier 51 to its non-inverting input. The amplifier 51 operates to hold its non-inverting input at a "virtual" potential of the common terminal 35. This discharges the capacitance $C_x$ from the circuit being measured and transfers that charge, without loss, to the capacitance C3. The voltage across the capacitance C3 is given at the output of the amplifier 51, denoted as $V_c$ in FIG. 1. Thus, this technique is insensitive to the telephone line series resistances 17 and 19 and the series resistance R4 of the instrument. The resistance R4 is desired in order to protect the instrument against high voltage surges which could be inadvertently applied to its terminals 35 and 37 while in use.

A third semiconductor switch 59 is connected across the terminals of the integrator capacitor C3. A gate terminal of the switch 59 is connected through a line 61 to the timing circuits 57. The semiconductor switch 59 is turned on after each measurement cycle to reduce the charge of the capacitance C3 to zero prior to the commencement of a further charge cycle.

The voltage $V_c$ from the output of the integrator is applied to a circuit 63 for appropriate processing which depends upon a particular display 65 which is utilized. The display 65 receives the signal from the processor 63 for displaying a quantity that is $V_c$ or something proportional to it. For special instruments designed to locate the position of a break in one of the telephone lines 13 and 15, the processor 63 can convert the $V_c$ information automatically into a signal applied to the display 65 so that the location of the break is shown directly. The circuit 63 may be a sample-and-hold circuit, or an analog-to-digital convertor, depending on the precise purpose of the instrument and the nature of the display 65 which the circuit 63 is designed to drive. A timing signal is generated in a line 67 from the timing circuit 57 and applied to the processing circuit 63 so that the signal $V_c$ is processed and displayed only at a time after the capacitor C3 is fully charged.

The capacitor C3 is of known value and of high precision. The instrument shown in FIG. 1 operates when its terminals 35 and 37 are connected respectively to the telephone line terminals 13' and 15' to give a voltage $V_c$ at the output of the integrating circuit that is as follows:

$$V_c = \frac{C_x}{C3}$$

From this equation, the unknown $C_x$ can be determined, either electronically in the processing circuits of 63 or with pencil and paper once the voltage output $V_c$ of the integrator is determined. The expression of equation (1) above is accurate only for very high values of the shunt resistance $R_s$ of the telephone line equivalent circuit 11. For values of $R_s$ that draw a significant amount of current during the charging and discharging process, an adaptive charging circuit in a form illustrated in FIG. 5, and discussed below, is preferred.

Figure 2:
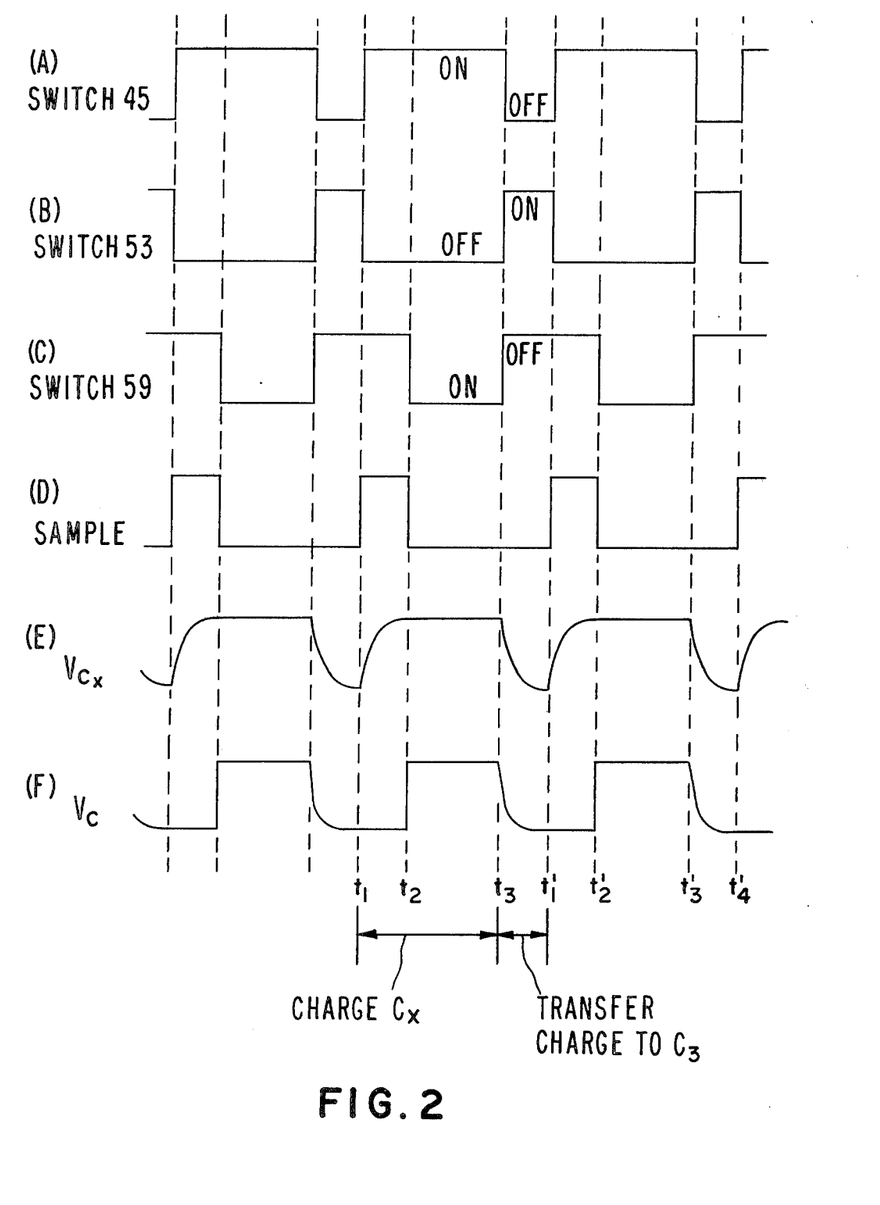
FIG. 2 (comprised of A–F) is a timing diagram that illustrates voltage waveforms at various points in the circuit of FIG. 1.

Referring to FIG. 2, a timing diagram of the instrument of FIG. 1 is shown. The semiconductor switches 45 and 53 are oppositely alternated between their conductive and non-conductive states as shown in FIG. 2A and 2B, respectively. Appropriate timing circuits 57 control the voltage in their gate leads 47 and 55 to bring about the reciprocal action illustrated. The capacitance discharge semiconductor switch 59 operates as shown in FIG. 2C and the output $V_c$ is sampled in a manner shown in FIG. 2D. FIG. 2E illustrates the voltage across the unknown capacitance $C_x$ and FIG. 2F shows the output voltage $V_c$ of the integrator of FIG. 1. The voltage waveforms shown in FIGS. 2E and 2F are results of the switching actions illustrated in FIGS. 2A through 2D.

The cycle of operation of the circuit of FIG. 1 may be followed by following a sequence in FIG. 2. At time $t_1$, as a convenient starting point, the charging of $C_x$ is just being initiated while the integrator circuit is disconnected from the terminals 35 and 37. (FIGS. 2A and 2B) At time $t_3$, the charging circuit 39 is disconnected from the instrument terminals 35 and 37 and the integrator is at the same instant connected to those input terminals (FIGS. 2A and 2B) Between the time $t_3$ and $t_1'$, the previously charged capacitance $C_x$ is being discharged into the known capacitance C3. The charge time and the charge transfer time are made long enough to effect those operations for the maximum $C_x$ expected to be tested. These times are also affected by the value of the series resistances R4, 17 and 19, but these resistances do not affect the ultimate value of $V_c$ so long as these times are sufficient to permit full charging and charge transfer.

The value of $V_c$ after the transfer cycle is read out between the times $t_1'$ and $t_2'$. (FIG. 2D) After this "sample" interval, the capacitance C3 is discharged. (FIG. 2C) This sample and discharge action occurs while the semiconductor switch 53 is off, thus disconnecting the integrating circuit from the external circuit being measured, simultaneously with this sample and discharging action occurring, the capacitance $C_x$ is being charged from the charging circuit 39. At the end of this second charging interval, at $t_3'$, the capacitance C3 has been discharged and its discharging switch 59 opened to permit another charge transfer during the period $t_3'$ to $t_4'$.

Figure 3:
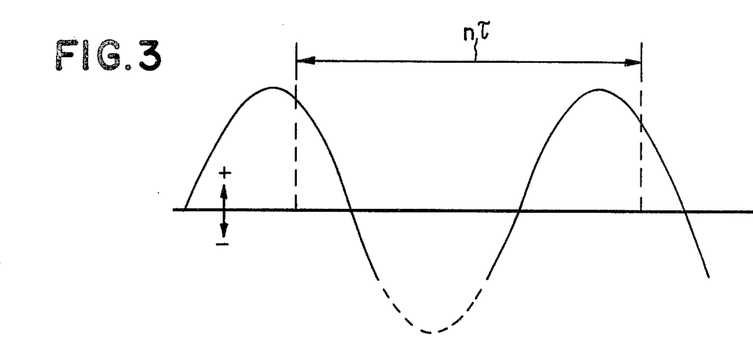
FIG. 3 illustrates a typical interfering waveform whose effect is to be compensated by the circuit of FIG. 1.

FIG. 3 illustrates generally the kind of interfering waveform which is often present in a telephone line under measurement as a result of induced currents from surrounding fields, such as that generated by the A.C. source 27 of the equivalent circuit representation 11 of a telephone line in FIG. 1. In the United States where the power system is at 60 Hertz, this interfering signal will have a fundamental of that frequency (period denoted by $\tau$) since telephone lines are often run in close proximity to power lines. Harmonics of this fundamental frequency are also often present. This induced voltage will present an error in a reading by the instrument of FIG. 1 since that voltage may contribute to the charging of the known capacitance C3 while having nothing to do with the value of the unknown capacitance $C_r$. It has been found, however, that if the charge transfer time (that is, the interval between $t_3$ and $t_1'$ of FIG. 2) is made to be an integral multiple $n$ of the fundamental period $\tau$ of the interfering waveform that its effect on the capacitor C3 is cancelled. That is, the net positive-going charge imparted to the capacitor C3 by the interfering signal is exactly equal to the net negative-going charge so transferred. Harmonics of the fundamental frequency are also cancelled for the same reason.

One convenient way of controlling the charge transfer interval to be an integral number of wavelengths of the fundamental frequency of the interfering waveform is to employ a very stable oscillator, such as one controlled by a crystal, as the heart of the timing circuit 57. The charge transfer interval can then be carefully controlled relative to a known interfering voltage fundamental frequency, such as 60 Hertz. A properly chosen interval may cancel interfering signals from more than one source of differing frequencies. However, the frequency of interfering voltages induced in telephone lines under measurement may vary slightly from this frequency. One cause of such variation is a shift in the power line frequency itself. Such a shift would induce a slight error in the measurement made by the circuit of FIG. 1 having a crystal oscillator controlled timing circuit 57. Thus, it is desirable to utilize, in combination with a crystal controlled or other precision oscillator as a timing base, an interference filter 49 that is tuned to have a maximum impedance to the interfering signal frequency. The filter 49 may include, as shown in FIG. 1, a series resistance and inductance in one leg thereof with a capacitance in another leg thereof, both legs connected in parallel with each other and the combination in series between the instrument input terminal 37 and the current limiting input resistance R4.

Figure 4:
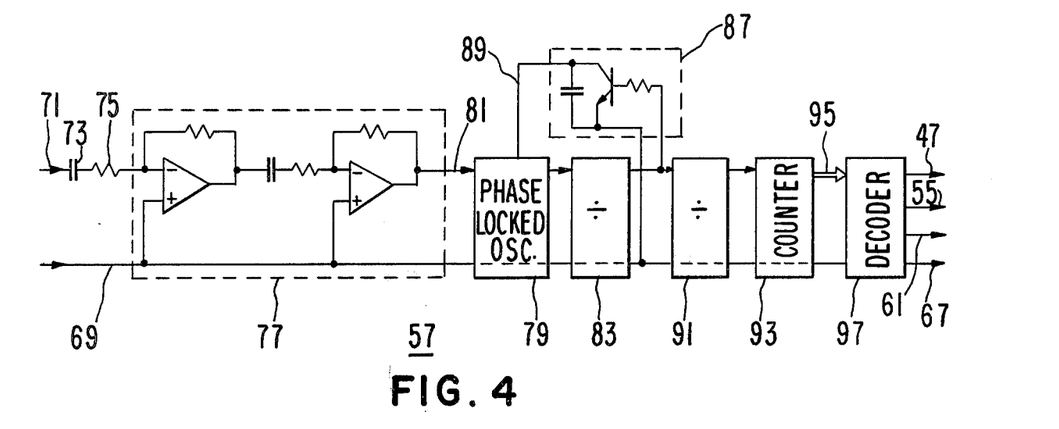
FIG. 4 is an expanded illustration of a preferred timing circuit of FIG. 1.

Although the independently controlled oscillator based timing circuit 57 and interference filter 49 combination give satisfactory results, more precision is obtained when the timing circuits 57 are locked to the actual interfering signal being induced in the telephone line 11. The timing circuits 57 maintain a connection 69 to the common terminal 35 of the instrument, in any event. But when the timing circuits 57 operate in a mode locked to the frequency of the interfering signal, a line 71 is provided to the second input terminal 37 of the instrument. A preferred timing circuit 57 utilizing this embodiment is shown in FIG. 4. The advantage of this embodiment is that the charge transfer time (between $t_3$ and $t_1'$ of FIG. 2) will automatically be adapted to frequency changes of the induced interfering signal, thus more carefully controlling the charge transfer time to be an integral number of periods of the fundamental frequency of that interfering signal.

Referring to FIG. 4, a series capacitance 73 and resistance 75 are provided to make the input impedance of the circuit 57 very high so it does not affect the operation of the remaining portions of the circuit of FIG. 1. The elements 73 and 75 are in series with the line 71 and a combination amplifier and filter circuit 77 and thence to a phase locked oscillator 79 at one input 81 thereof. The circuit 77 has a purpose of amplifying the fundamental component of the interfering signal and its harmonics while rejecting other frequencies. Therefore, an amplified version of the interfering signal in the telephone line under test is presented in the line 81 at one input to the phase locked oscillator.

The signal output of the oscillator is most conveniently applied to a divider circuit 83 in order to reduce its output frequency by some integer. This divider is not necessary and is introduced to permit the oscillator to operate at a higher frequency for other purposes. This divided signal in an output line 85 is also applied to a feedback network 87 which develops timing signals in a line 89 which is connected to a second input of the phase locked oscillator 79. As is well known, the output of the oscillator is automatically adjusted by its internal circuitry to minimize the frequency error between its input at a line 81 and its feedback signal in the line 89. Since harmonics of the fundamental frequency are also a possible interfering signal, a feedback circuit 87 is provided to convert a squarewave output in the line 85 to a sawtooth waveform of the same frequency in the line 89, which thus includes the fundamental and all harmonics thereof of the waveform 85. This permits the oscillator 79 to lock onto any of the fundamental or harmonics of the interfering waveform as presented at its input line 81. The oscillator 79 and divider 83 are conveniently available as commercial items.

A second frequency divider 91 may also be desirable, depending on the specific circuit design utilizing these principles. An output of the second divider 91 drives a four bit binary counter 93. The count of the counter 93 appears in its output circuit 95. These output circuits are connected to an input of a decoder 97 to present at separate output lines 47, 55, 61 and 67 the control signals illustrated in FIGS. 2A through 2D, as explained hereinabove.

When the circuit of FIG. 4 is used as the timing circuit 57, in a preferred embodiment, the interference filter 49 is no longer necessary for reducing the level of the interfering signal applied to the capacitance C3. The interfering signal is completely compensated for by the circuit of FIG. 4. However, the interference filter 49 may be desirable when the circuit of FIG. 4 is utilized as the timing circuit 57 in order to increase the voltage of the interfering signal across the input lines 69 and 71 to the timing circuit. The interference filter 49 may also be desirable to reduce the dynamic signal swing requirements of the integrator 51.

Alternatively to monitoring the frequency of the interfering signal from the signal as it appears at the input terminals 35 and 37 itself, the lines 69 and 71 could be connected directly to a power circuit which is generating the field causing the interfering signal.

Figure 5:
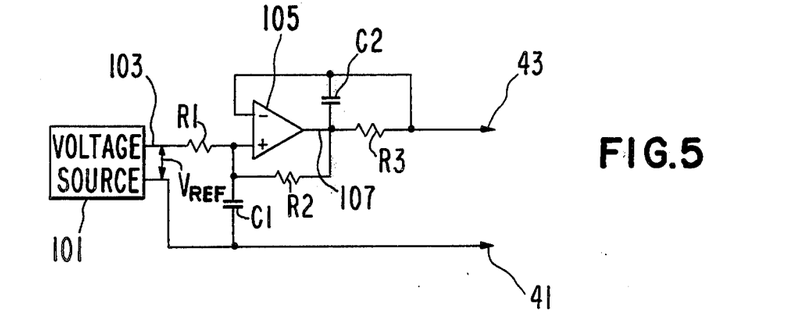
FIG. 5 is a circuit diagram of a preferred charging circuit in the embodiment of FIG. 1.

For measuring situations when the resistance $R_x$ is low enough to drain off charge from the capacitance $C_r$ before all of that charge can be transferred to the known capacitance C3 of FIG. 1, some compensation must be made. This leakage through the shunt resistance $R_s$ is minimized by making the charge transfer interval immediately follow disconnection of the charging circuit 39 from the capacitance $C_x$, but since the discharge of $C_x$ into the known capacitor C3 does take time because of series resistance therebetween, a low value of $R_s$ will bleed off some of the charge from $C_x$ that should be transferred to the known capacitor C3 if an accurate reading is to be made. Thus, an adaptive charging circuit is illustrated in FIG. 5 which compensates for a wide range of values of $R_s$. The circuit of FIG. 5 is utilized as the charging circuit 39 in FIG. 1, in a preferred embodiment of the instrument.

Referring to FIG. 5, a carefully controlled voltage source 101 is provided that maintains a voltage output between a line 103 and the common line 41 that is constant within narrow tolerances. The constant voltage in the line 103 is applied through a resistance R1 to a non-inverting input of an operational amplifier 105. A resistance R2 is connected between an output 107 of the amplifier 105 and the non-inverting input. A resistance R3 is connected in series with the amplifier output 107 and the charging circuit output line 43. The output line 43 is also connected to an inverting input of the amplifier 105. The capacitances C1 and C2 are provided to filter out transients.

When the circuit of FIG. 5 is utilized as the charging circuit 39 in FIG. 1, equation (1) above can be restated as follows:

$$V_c = \frac{C_x}{C3} \cdot V_{Ref} \quad (2)$$

Equation (2) is useful for accurately determining the capacitance value $C_x$ when the shunt resistance $R_s$ of FIG. 1 is very high, near infinity. The adaptive voltage supply circuit of FIG. 5, however, compensates for the effect of a low finite shunt resistance $R_s$ on the measurement so that the equation of FIG. 2 is still correct, at least when $R_s$ is in a range assumed when other circuit components of FIG. 5 are chosen, as discussed below.

The circuit of FIG. 5 causes the applied voltage between the lines 41 and 43 to increase as the current drawn through the line 43 increases. This means that near the end of a charging cycle when the unknown capacitance $C_x$ is approaching full charge that the voltage applied thereto will be proportional to the amount of current drawn by the shunt resistance $R_s$. That is, the capacitance $C_x$ is given an extra amount of charge to compensate for the charge drawn off by the shunt resistance $R_s$ during the charge transfer time. With this extra charge being given to the capacitance $C_x$, the equation (2) stated above may be utilized no matter what the value of the shunt resistance $R_s$, within certain limits. This also requires that the charging cycle (between times $t_1$ and $t_3$ of FIG. 2) be long enough so that equilibrium is obtained wherein the voltage between the lines 41 and 43 reaches a steady state value.

The circuit of FIG. 5, when used as part of the instrument illustrated in FIG. 1, precisely compensates for the shunt resistance $R_s$ when the following expression is satisfied:

$$\left(1 - \frac{K}{R_4 + R_s}\right)^{-1} = \left(1 + \frac{R4}{Rx}\right)^2 \quad (3)$$

where $$K = \frac{R1 \cdot R3}{R2}$$

If $R_s$ is assumed to be 30,000 ohms, R4 chosen to be 3,000 ohms for adequate input protection to the instrument of FIG. 1 and resistances R1 and R2 of FIG. 5 chosen to be 10,000 ohms and 50,000 ohms, respectively, for proper operation of that circuit, R3 is calculated from equation (3) above as the sole unknown to be approximately 2,850 ohms. The assumption of $R_s=30,000$ ohms is optimum for the instrument as described herein for use with telephone lines. There is practically no error for other values of $R_s$ above 30,000 ohms and the accuracy even remains good for values of the shunt resistance $R_s$ for a region below 30,000 ohms.

The various aspects of the present invention have been described with respect to a preferred embodiment thereof but it will be understood that the invention is entitled to protection within the full scope of the appended claims.

I claim:

1. A method of determining the capacitance of an electrical circuit having a periodic interfering voltage induced or generated therein, comprising the steps of:
   applying a direct current voltage to the circuit for a time sufficient to charge the capacitance thereof,
   transferring for a time substantially all of the charge from said circuit capacitance to a capacitor of known value outside of said circuit,
   monitoring the circuit during said transfer time to detect a fundamental frequency of said interfering voltage, said transfer time being made equal to an integral number of periods of the detected fundamental frequency of said interfering voltage in circuit, and
   measuring the voltage across said known capacitor, whereby said voltage is proportional to the capacitance of said electrical circuit.

2. The method according to claim 1 wherein the step of transferring the charge from the circuit capacitance to the external capacitor includes transferring an electrical current from said circuit capacitance through a filter tuned to reject the frequency of said periodic interfering voltage prior to applying the electrical current to the known value capacitor.

3. A method according to claim 1 wherein said electrical circuit is a telephone line.

4. The method according to claim 2 wherein the step of transferring the charge through a filter includes use of a filter having capacitance connected only in series with a non-capacitance direct current path in parallel therewith.

5. The method according to claim 1 wherein the step of monitoring includes the step of connecting a phase locked oscillator to said circuit in a manner that an oscillator output signal has a frequency proportional to the fundamental frequency of the interfering voltage, said transfer time being established from said oscillator output frequency.

6. The method according to claim 1 wherein the step of applying a direct current voltage to the circuit includes the step of applying a voltage having a magnitude that is proportional to the value of said shunting resistance, said charging voltage having a base reference magnitude when said resistance is infinite and an increasing magnitude for lesser values of resistance.

7. The method according to claim 1 wherein the step of applying a direct current voltage to the circuit comprises the steps of:
applying the voltage for a period that exceeds the time necessary to fully charge the capacitor, and
controlling the magnitude of the charging voltage to increase during the charging period to an amount proportional to the current drawn by the electrical circuit during the charging time,
whereby the ultimate steady state voltage applied to said circuit during the charging period is a function of the value of said shunting resistance.

8. A method of determining the capacitance of an electrical circuit having a finite effective resistance shunting its capacitance, comprising the steps of:
applying during a first time a voltage to said electrical circuit in a manner to charge the capacitance thereof, said charging voltage being chosen to have a magnitude that is proportional to the value of said shunting resistance, said charging voltage having a base reference magnitude when said resistance value is infinite and an increasing magnitude for lesser values of resistance,
transferring during a second time substantially all of the charge from said circuit to a capacitor of known value outside of said circuit, whereby compensation for charge drained from the circuit capacitance by the shunting resistance during charge transfer has been provided during the step of charging the circuit capacitance, and
measuring the voltage of said known capacitor, whereby said voltage is proportional to the capacitance of said electrical circuit.

9. A method according to claim 8 wherein the step of transferring the charge includes transferring an electrical current from said circuit capacitance through a filter tuned to reject the frequency of any periodic interfering voltage that might exist in the electrical circuit under test prior to applying the electrical current to the known value capacitor.

10. A method according to claim 8 wherein said electrical circuit is a telephone communication line.

11. A method of determining the capacitance of an electrical circuit having a finite effective resistance shunting its capacitance, comprising the steps of:
applying during a first time a voltage to said electrical circuit in a manner to charge the capacitance thereof, said charging voltage being chosen to have a magnitude that is proportional to the value of said shunting resistance, said charging voltage having a base reference magnitude when said resistance value is infinite and an increasing magnitude for lesser values of resistance, said first time exceeding the time necessary to fully charge the capacitor, said voltage applying step additionally including controlling the charging voltage magnitude proportional to the current drawn by said electrical circuit during said first time, whereby the ultimate steady state voltage applied to said circuit is a function of the value of said shunting resistance,
transferring during a second tome substantially all of the charge from said circuit to a capacitor of known value outside of said circuit, whereby compensation for charge drained form the circuit capacitance by the shunting resistance during charge transfer has been provided during the step of charging the circuit capacitance, and
measuring the voltage of said known capacitor, whereby said voltage is proportional to the capacitance of said electrical circuit.

12. The method according to claim 11 wherein said electrical circuit includes a telephone communication line.

13. A method of determining the capacitance of a telephone circuit having an effective finite resistance shunting the capacitance and a periodic interfering voltage induced therein, comprising the steps of:
applying during a first time a voltage to said telephone circuit in a manner to charge the capacitance thereof, said charging voltage being chosen to have a magnitude that is proportional to the value of said shunting resistance, said charging voltage having a base reference magnitude when said resistance value is infinite and an increasing magnitude for lesser values or resistance,
connecting said circuit during a second time immediately following said first time to an electronic integrator formed of an operational amplifier with a known value capacitor in a feedback loop, whereby said telephone circuit capacitance charge is transferred to said integrating capacitor, said second transfer time being equal to an integral number of periods of a fundamental frequency of said interfering voltage, and
measuring the voltage of said known capacitor after said second time, whereby said voltage is proportional to the capacitance of said telephone circuit.

14. Apparatus for measuring the capacitance of an electrical circuit, such as a telephone communication line, across two terminals thereof, comprising:
two input terminals capable of being connected to said two terminals of the electrical circuit under test,
means including a control voltage source for charging the capacitance of said electrical circuit,
an integrator including an operational amplifier with an integrating capacitor connected between its output and one of two inputs,
an input impedance including a filter tuned to present a maximum impedance at a particular frequency, said filter including a capacitance element connected only in series and having a non-capacitive direct current path in parallel with the capacitance element,
timing means for alternating switching connection between said charging means and integrating means to said terminals through said input impedance, and
means connected to the output of said operational amplifier for measuring the voltage of said integrating capacitor, whereby said voltage is proportional to the desired capacitance of said electrical circuit.

15. Apparatus according to claim 14 wherein said timing means includes means for limiting the time that said integrating means is connected to said input to a carefully controlled time, whereby said time may be chosen to be an integral multiple of an interfering voltage generated or induced in the electrical circuit under test.

16. Apparatus according to claim 15 wherein said timing means includes means connecting said timing means to said input terminals for controlling the time that said integrating means is connected to said terminals to be an integral multiple of an interfering alternating current signal received from an electrical circuit under test through said terminals.

17. Apparatus for measuring the capacitance of an electrical circuit, such as a telephone communication line, across two terminals thereof, comprising:
two input terminals capable of being connected to said two terminals of the electrical circuit under test,
means including a controlled voltage source for charging the capacitance of said electrical circuit, said charging means including means responsive to current flowing into an electrical circuit under test for increasing the charging voltage as the current increases, thereby to provide the external electrical circuit capacitance with an additional charge to compensate for a loss of said charge through a shunt resistance when the circuit capacitance charge is transferred to the integrating means,
an integrator including an operational amplifier with an integrating capacitor connected between its output and one or two inputs,
an input current limiting impedance,
timing means for alternating switching connection between said charging means and integrating means to said terminals through said input impedance, and
means connected to the output of said operational amplifier for measuring the voltage of said integrating capacitor, whereby said voltage is proportional to the desired capacitance of said electrical circuit.

18. Apparatus according to claim 17 wherein said charging means includes:
an operational amplifier having an output, and inverting and non-inverting inputs,
a constant voltage source connected between a common and said non-inverting input of said amplifier through a series resistance,
a resistance in series with said amplifier output,
a current path connected between the output of said amplifier output series resistance and its said inverting input, and
a feedback resistor between said output of said operational amplifier and its said non-inverting input, whereby said variable voltage source appears between said common and the output of said amplifier output series resistance.

19. A method of determining the capacitance of a telephone circuit having an effective finite resistance shunting the capacitance and a periodic interfering voltage induced therein, comprising the steps of:
applying during the first time a voltage to said telephone circuit in a manner to charge the capacitance thereof, said charging voltage being chosen to have a magnitude that is proportional to the value of said shunting resistance, said charging voltage having a base reference magnitude when said resistance value is infinite and an increasing magnitude for lesser values of resistance,
connecting said circuit during a second time immediately following said first time to an electronic integrator including a known value integrating capacitor, whereby said telephone circuit capacitance charge is transferred to said integrating capacitor, said second transfer time being equal to an integral number of periods of a fundamental frequency of said interfering voltage, and
measuring the voltage of said known capacitor after said second time, whereby said voltage is proportional to the capacitance of said telephone circuit.

20. A method of determining the capacitance of an electrical circuit having a periodic interfering voltage induced or generated therein, comprising the steps of:
applying a direct current voltage to the circuit for a time sufficient to charge the capacitance thereof,
transferring for a time substantially all of the charge from said circuit capacitance through a filter tuned to reject a voltage having a period of said interfering voltage to a capacitor of known value outside of said circuit, said transfer time being equal to an integral number of periods of a fundamental frequency of said interfering voltage in said electrical circuit, said filter being characterized by a capacitance connected only in series and having a non-capacitive direct current path in parallel therewith, and
measuring the voltage across said known capacitor, wherein said voltage is proportional to the capacitance of said electrical circuit.

21. The method according to claim 20 wherein said electrical circuit includes a telephone communication line.

22. Apparatus for measuring the capacitance of an electrical circuit, such as a telephone communication line, across two terminals thereof, comprising:
two input terminals capable of being connected to said two terminals of the electrical circuit under test,
means connected to said two input terminals for charging the capacitance of said electrical circuit, said charging means including means responsive to current flowing into an electrical circuit under test for increasing the charging voltage across said two input terminals in response to the current increasing, thereby to provide the external electrical circuit capacitance with an additional charge to compensate for a loss of charge through a shunt resistance of the electrical circuit under test,
a capacitor of a known value,
timing means for sequentially making effective connection of said input terminals first to said charging means for a charging time and then to said known capacitance for a charge transfer time, and
means operably connected to said known capacitance for measuring the voltage thereacross, whereby said voltage is proportional to a capacitance of said electrical circuit under test.

23. Apparatus according to claim 22 wherein said circuit capacitance charging means comprises:
an operational amplifier having an output, and inverting and non-inverting inputs,
a constant voltage source connected between a common and said non-inverting input of said amplifier through a series resistance,
a resistance in series with said amplifier output,
a current path connected between the output of said amplifier output series resistance and its said inverting input, and
a feedback resistor between said output of said operational amplifier and its said non-inverting input, whereby said variable voltage source appears between said common and the output of said amplifier output series resistance.

24. Apparatus according to claim 22 wherein said timing means includes means for setting said charging time to a value permitting said charging means to stabilize to a steady state charging voltage.

25. Apparatus according to claim 22 wherein said timing means includes means responsive to the signal at said input terminals for setting said transfer time equal to an integral number of periods of a fundamental frequency of an alternating current interfering voltage presented to said two input terminals.

26. Apparatus according to claim 25 wherein said transfer time setting means comprises:
   a phase locked oscillator with a frequency controlling input connected to said two terminals in a manner that the oscillator output frequency is a function of an input frequency of an alternating current voltage appearing across said two terminals, and
   means receiving the output of said oscillator for applying it to said timing means in a manner to control the time that said known capacitance is connected to be charged from said two input terminals, whereby the charging time of said known capacitance is controlled to eliminate an effect thereon of an alternating current voltage existing in the circuit under test.

27. Apparatus according to claim 26 which additionally comprises a filter tuned to present a maximum impedance at a particular frequency and connected in the circuit path between one of said two input terminals and said known capacitance, whereby the filter may be tuned to exclude an interfering signal from affecting the charge transferred to said known capacitance and further increases the voltage available to said transfer time setting means.

28. Apparatus for measuring the capacitance of an electrical circuit, such as a telephone line, across two terminals thereof, comprising:
   two input terminals capable of being connected to said two terminals of the electrical circuit under test,
   means including a controlled voltage source for charging the capacitance of said electrical circuit,
   a capacitor of known value,
   switching means for alternately connecting said controlled voltage source and said known capacitance to said two input terminals, and
   means controlling said switching means for setting the period of time during which said known capacitance is operably connected to be charged from the voltage existing at said two input terminals, including means connected to said two terminals for sensing the fundamental frequency of any alternating current voltage present thereat and setting the capacitance charging time to be equal to an integral number of periods of the sensed voltage fundamental frequency, whereby the timing means is automatically adjusted to eliminate any effect of such an alternating current upon the charge transferred from said terminals to said known capacitance.

29. Apparatus according to claim 28 wherein said sensing means includes:
   a phase locked oscillator having an output signal whose frequency is controlled by the frequency of a signal presented to said input, said input being connected to receive any alternating current signal across said two input terminals, and
   means receiving the output of said oscillator and connected to said timing means for controlling the length of time that said capacitor is operably connected to said two input terminals.

* * * * *